(12) United States Patent
Joanni et al.

(10) Patent No.: US 11,003,822 B2
(45) Date of Patent: May 11, 2021

(54) ANALYZING THE STATE OF A TECHNICAL SYSTEM WITH RESPECT TO REQUIREMENTS COMPLIANCE

(71) Applicant: SIEMENS AKTIENGESELLSCHAFT, Munich (DE)

(72) Inventors: Andreas Joanni, Munich (DE); Daniel Ratiu, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/579,984

(22) PCT Filed: Dec. 15, 2016

(86) PCT No.: PCT/EP2016/081204
§ 371 (c)(1),
(2) Date: Dec. 6, 2017

(87) PCT Pub. No.: WO2018/108280
PCT Pub. Date: Jun. 21, 2018

(65) Prior Publication Data
US 2019/0294737 A1    Sep. 26, 2019

(51) Int. Cl.
*G06G 7/48*  (2006.01)
*G06F 30/3323*  (2020.01)
(Continued)

(52) U.S. Cl.
CPC .......... *G06F 30/3323* (2020.01); *G06F 30/00* (2020.01); *G06F 30/15* (2020.01); *G06Q 10/06* (2013.01)

(58) Field of Classification Search
CPC ...... G06F 30/00; G06F 30/15; G06F 30/3323; G06Q 10/06
(Continued)

(56) References Cited

U.S. PATENT DOCUMENTS

| | | | |
|---|---|---|---|
| 2004/0181321 A1* | 9/2004 | Fries | B61L 1/187 701/19 |
| 2015/0009331 A1* | 1/2015 | Venkatraman | B61L 23/041 348/148 |
| 2016/0221592 A1* | 8/2016 | Puttagunta | B61L 25/04 |

FOREIGN PATENT DOCUMENTS

WO    02073475 A1    9/2002

OTHER PUBLICATIONS

Palumbo M.: "Requirements Management for Safety Critical Systems", . Jul. 2015 (Jul. 2015). pp. 1-7, XP055396274, Retrieved from the Internet: URL:http://www.railwaysignalling.eu/wp-content/uploads/2015/06/Req mgt safety critical system MPalumbo.pdf; 2015.

(Continued)

*Primary Examiner* — Andre Pierre Louis
(74) *Attorney, Agent, or Firm* — Schmeiser, Olsen & Watts LLP

(57) ABSTRACT

The following refers to a computer-implemented approach for evaluation of contractual requirements in view of a technical railway system, namely whether the latter complies with the requirements. The technical railway system and is modeled in case of non-compliance the system is modeled and contractual requirements are modeled in one common model. The generated model is analyzed in order to calculate control instructions for matching the same.

11 Claims, 3 Drawing Sheets

Figure 1:
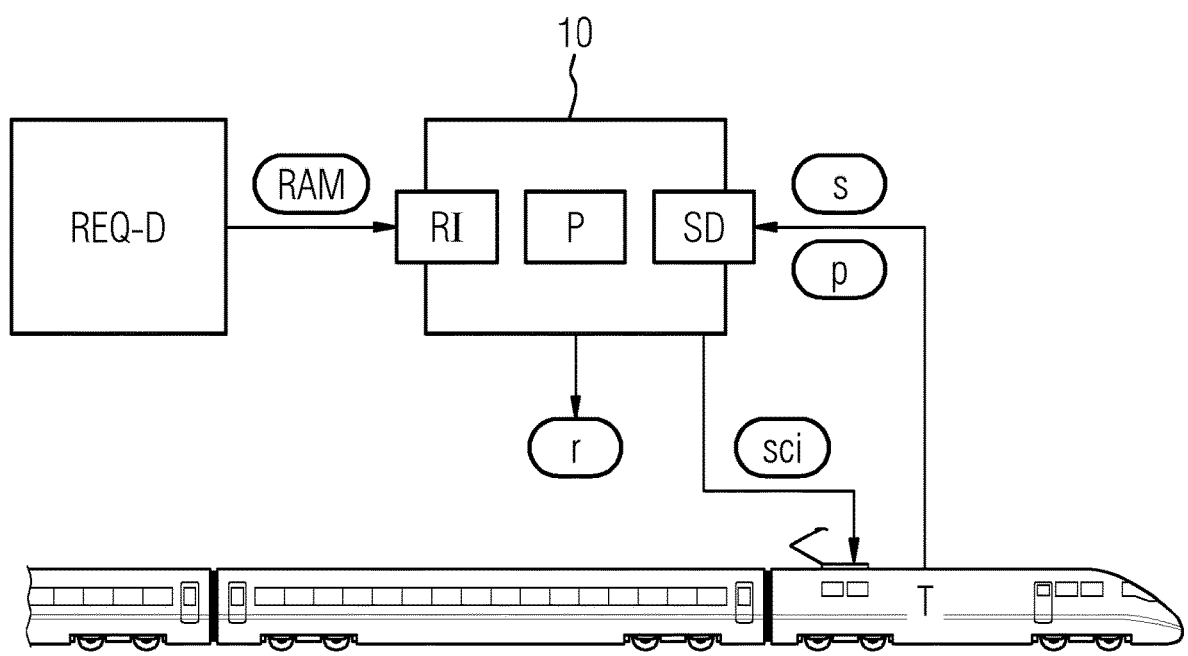

(51) Int. Cl.
  *G06Q 10/06* (2012.01)
  *G06F 30/00* (2020.01)
  *G06F 30/15* (2020.01)
(58) Field of Classification Search
  USPC .............................................................. 703/8
  See application file for complete search history.

(56) References Cited

OTHER PUBLICATIONS

Haxthausen Anne E.: "Automated Generation of Safety Requirements from Railway Interlocking Tables", Leveraging Applications of Formal Methods, Verification and Validation. Applications and Case Studies, Springer Berlin Heidelberg, Berlin, Heidelberg, pp. 261-275, XP047018934; ISBN: 978-3-642-34031-4; 2012.

Flammini F. et al: "Model-Driven V&V Processes for Computer Based Control Systems: A Unifying Perspective", Leveraging Applications of Formal Methods, Verification and Validation. Applications and Case Studies, Springer Berlin Heidelberg, Berlin, Heidelberg, pp. 190-204, XP047018929, ISBN: 978-3-642-34031-4; 2012.

Iliasov A. et al: "The SafeCap toolset for improving railway capacity while ensuring its safety", RRUKA Annual Conference 2012; pp. 1-6, XP055396463, Retrieved from the Internet: URL:http://eprint.ncl.ac.uk/file store/production/188460/4A4EOA94-BD3E-4D68-80E3-0BIAF43B6D49~pdf; 2012.

Heng Kuang et al: "Self-Monitoring of Non-functional Requirements in Reactive Autonomie Systems Framework: A Multi-agent Systems Approach", Computing in the Global Information Technology, 2008. ICCGI '08. The Third International Multi-Conference on, IEEE, Piscataway, NJ, USA, pp. 186-192, XP031299648, ISBN: 978-0-7695-3275-2; 2008.

Hartonas-Garmhausen V et al: "Verification of a safety-critical railway interlocking system with real-time constraints", Fault-Tolerant Computing, 1998. Digest of Papers. Twenty-Eighth Annual International Symposium on Munich, Germany Jun. 23-25, 1998, Los Alamitos, CA, USA, IEEE Comput. Soc. US, pp. 458-463, XP032385015, DOI: 10.1109/FTCS.1998.689498 ISBN: 978-0/8186-8470-8; 1998.

PCT International Search Report dated Aug. 22, 2017 corresponding to PCT International Application No. PCT/EP2016/081204 filed Dec. 15, 2016.

European Communication pursuant to Article 94(3) EPC dated Mar. 15, 2021 for Application No. 16 816 254.3.

* cited by examiner

ANALYZING THE STATE OF A TECHNICAL SYSTEM WITH RESPECT TO REQUIREMENTS COMPLIANCE

CROSS-REFERENCE TO RELATED APPLICATIONS

This application claims priority to PCT Application No. PCT/EP2016/081204, having a filing date of Dec. 15, 2016, the entire contents of which are hereby incorporated by reference.

FIELD OF TECHNOLOGY

Technical systems need to comply with technical requirements, inter alia with respect to reliability, availability and maintainability (RAM).

BACKGROUND

In a development phase, i.e. during development of a system as well as in an operational phase, i.e. (after shipment and delivery) during application and execution of the technical system, the system has to be analyzed whether it complies with the requirements.

In case of non-compliance, for example caused by decreased performance, costs and penalties may arise. Generally, performance parameters are essential indicators for system quality.

On the one hand, the requirements have to be defined so that in principle they may be met by the technical system.

On the other hand, the technical system has to be adapted in order to comply with the requirements. Thus, the requirements and the technical system are interrelated. Also, the different requirements may be complex and show interdependencies.

In a complex technical system, like a railway system, system performance needs to be detected (including decreased system performance, for instance through the effect of random failures).

In the state of the art it is known to model complex systems in a domain specific language (DSL). In software development, a domain-specific language is a programming language or specification language tailored to a particular problem domain, a particular problem representation technique, and/or a particular solution technique. DSLs are compiled into general-purpose programming languages, for example, C or C#. This is, because general-purpose programming languages have advantages relating to speed and portability, since a large body of existing technology and tools has already been developed for them.

In state of the art systems, the mapping between the technical system and the requirements was analyzed manually, which leads to the risk of inadequate, incomplete or flawed implementation and, therefore, erroneous analysis results.

SUMMARY

An aspect relates to a method, system and a computer program for automatically processing and valuating a technical system's state with respect to its requirements. The processing should be done in a structured and formalized manner. Conflicting requirements, as well as decreased performance of the technical system and requirement violations should be detected as early as possible and in a reliable and automatic manner.

According to a first aspect, embodiments of the present invention refer to a method for digitally processing and valuating requirements for a technical system. The method is executed on at least one computer processing device, including a system state analyzer, which is configured to execute computer-executable instructions stored in a memory to perform the following actions:

Receiving determined requirements for the technical system
   Receiving a determined state of the technical system
   Modeling the determined requirements commonly with the determined technical system state using a formal description, like a domain specific language (DSL)
   In the modeled system: analyzing whether the requirements are met by the technical system and in case of non-compliance:
   computing requirement control instructions, that indicate how the requirements have to be adapted, so that they are feasible by the technical system and concurrently
   computing system control instructions, that indicate how the technical system state has to be amended in order to meet the requirements.

In the following a short definition of terms is given, which are used in this application.

The requirements are—in a preferred embodiment—non-functional requirements. They may comprise quality and/or performance requirements and they may be described in contracts. The requirements relate to the technical system and may define a reliability value, an availability value and/or a maintainability value of said system, or other performance requirements like output yielded by said system. The requirements may serve as performance indicators and are—according to a preferred embodiment of the invention—used as performance indicator. Thus, requirements are processed in combination with the system's performance measure. Assessment of the degree of compliance with requirements may necessitate a quantification of the effect of random failures on the performance of the technical system. In case the technical system does not comply with the defined requirements, the resulting impact is (according to a preferred embodiment) quantified. The impact may comprise penalties or costs for non-compliance with requirements. The impact may also comprise negative side effects with other systems. The requirements describe what the technical system is supposed to do (operating a railway system in a specific operational mode, operating without unplanned interruptions, yielding a certain product output, processing data, control technical entities, regulate the temperature etc.). Further, the requirements describe how to operate or run the technical system (logging functionality, startup/shutdown controls, monitoring, resource consumption, back up, availability etc.). Further, the requirements describe how the system is built (which technical entities, the number of technical entities, the degree of redundancies, the quality of the technical entities, which data processing system, which language for processing data, which operating system and what kind of standards to be adhered to etc.). In another preferred embodiment the requirements may be functional or operational (technical).

The technical system is a complex system and may be a traffic engineering system and in particular a railway system. The system is build up by different modules which are interrelated (e.g. the railway network system, the trains, a control system for the driven trains etc.). The technical system integrates different subsystems and must comply with requirements from different parties (e.g. suppliers, customers etc.). Alternatively, the technical system may refer to a power plant or to an energy system or another complex electrical system.

The state of the technical system may comprise different technical parameters, comprising a failure state, an environmental state and an operational state. The state varies over time and is thus processed as a time-dependent variable. The environmental state describes how the technical system functions and interacts with surrounding systems (e.g. other transport systems, a general emergency notification system etc.). The operational state describes the manner in which the technical system is operated (e.g. in a normal operation mode, in a reduced mode which reduced functionality or performance, in a high performance mode etc.). The system's state may be determined by receiving input signals directly from the system via input interfaces or indirectly from intermediate systems like a database or from manufacturer data (for instance electronic data sheets). Further, if the method is applied in the operational phase after shipment and delivery of the system and during execution of the system, it is possible to detect the system's state with actual sensor data. Sensor data may be directly imported via an interface for processing and valuating compliance with the requirements.

Modeling is a process which transforms a real physical or technical system or measurement data thereof in an abstract model, which may be processed by a computer, with software and hardware. In this context requirements for the technical system and the system itself are modeled jointly in one common model and therefore may be processed in a formalized manner in a fully automated version by means of a computing device. By using a modeling technique, the advances in Information Technology can generate an information gain and completely new opportunities and hence influence the design of specific business process layouts for the technical system, because inter alia it is possible to filter out the irrelevant complexities of the real world, so that efforts can be directed towards the most important parts of the technical system. Benefits of aligning the design of technical development of the technical system and related business processes with the design of their corresponding Information Systems is apparent. Further, according to an embodiment of the invention, requirements may be processed which involve time-dependent criteria and complex interrelations between different aspects (parameters) of the processed requirements.

Analyzing is a computer-based, fully automatic process, which preferably is hidden for the user and is executed by means of algorithms on a machine. Thus, typically, the analyzing is executed without any user interaction and in a fully automated manner on a computing device, which may be a processor, a computer, a computing network or a cloud system.

The system control instructions and the requirement control instructions are machine readable instructions. These instructions may be subject to post processing for system development, system amendment and specification or changing of the requirements.

The requirement control instructions and the system control instructions are data sets which may be provided on a user interface. Both data sets are technical in nature, as both refer to technical entities and represent technical information. These data sets may also be forwarded to a requirement definition computing device and back to the technical system for adaption of the requirements and/or the technical system (state), for instance for adaption of the operational mode of the technical system. For example, both of the control instructions may be fed into a stochastic processing tool for processing probabilities for certain system states or events.

Generally, there exist two applications for the method and system described above:
1. First, the method and system may be executed in a design phase, in which the technical system is planned and is not yet developed. In this phase, both, the requirements as well as the system may be configured and synchronized.
2. Second, the method and system may be executed in an execution phase, in which the technical system has been shipped to the client and is monitored for complying with requirements.

According to a preferred embodiment of the present invention, the requirements are parameterized and comprise a reliability parameter set of the technical system, an availability parameter set of the technical system, a maintainability parameter set of the technical system, and/or a product yield parameter set of the technical system. This has the advantage that the most important requirements aspects may be represented in the system.

According to another preferred embodiment of the present invention, the method further comprises the step of:
determining performance data of the technical system.

This has the technical effect that performance of the system may be monitored in response to requirement specification. In other preferred embodiments it is also possible to determine other data of the technical system, like cost risk data and/or technical risk data. By capturing this data it is possible to provide an extensive basis of data, referring to the technical system in order to provide a realistic valuation.

According to another preferred embodiment of the present invention, the method further comprises the following step in case that the technical system does not meet the requirements:
calculating impact result data, indicating the impact of non-compliance according to the determined requirements.

The impact result data represent the impacts of non-compliance of the technical system with the requirements. The impact result data may inter alia quantify the financial impact. This is due to the fact, that non-conformance with contractual requirements by system developers, like the applicant, may result in severe penalties and other costs over long time periods, besides potential loss of reputation. Failure to properly quantify the financial impact and risk (valuation) of (non-conformance with) contractual requirements may significantly reduce the profitability of projects or lead to lost opportunities. The impact result data may also quantify the impact in terms of inefficient use of operational resources, adverse environmental impact, etc. Therefore, the impact result data is stored in a data storage and may be accessible for later evaluations and analysis.

According to another preferred embodiment of the present invention, the system state comprises a failure state with failure detection. This feature allows for a quality improvement.

According to another preferred embodiment of the present invention, in case a specific requirement or a part thereof is not met, it is automatically analyzed whether this requirement violation impairs compliance with other requirements. This feature has the technical effect to represent interrelations between the requirements and their impact on the technical system. In such case, parallel requirements are impaired, these impaired requirements are automatically detected and checked.

According to another preferred embodiment of the present invention, the method further comprises:

automatically detecting a conflict in the determined requirements. Moreover, optionally it is possible to automatically resolve the detected conflict by providing a corrected suggestion for at least one of the requirements. This has the technical advantage that inconsistent input values are detected as early as possible and the system may proceed without delay.

According to another preferred embodiment of the present invention, the method further comprises:

providing a result of the analysis and—in case of non-compliance—the computed system control instructions and the computed requirement control instructions on a user interface.

Generally, in a preferred embodiment of the present invention, the system comprises a user interface for data exchange. This user interface may be used for providing the processed control instructions to the user. In addition a button may be integrated on the user interface for receiving a confirmation signal, which may be entered by the user for confirming the control instructions. If this user confirmation signal will not be received, the execution of the control instructions may be postponed or even stopped.

According to another preferred embodiment of the present invention, the method is implemented as web service and may be accessed via a (secured) network connection on several devices (including mobile devices and others). This has the technical effect that requirements may be determined at another location (site) and from another system than the state of the system is determined. This has the advantage, that the system may be used in a distributed form from a plurality of different computing entities.

The method may be executed in a development phase, in which the technical system or parts thereof are developed in view of the determined requirements. In addition or alternatively, the method may also be executed in an operational phase, in which the technical system or parts thereof have already been shipped and delivered and are executed or operated. In this phase, the operation of the system may be monitored with respect to fulfillment of the defined requirements. In case of non-compliance, penalties, possible costs and other impacts are automatically calculated, which have been defined in contracts. Thus, the fulfillment of the regulations, stipulated in the contract may be automatically monitored. Failures may be reported as early as possible.

According to another aspect, embodiments of the invention refer to a system state analyzer for processing requirements for a technical system, comprising:

A requirement interface for receiving determined requirements;

A system detector, which is interfacing with the technical system and which is adapted for receiving a state of the technical system; the system detector may be implemented as input interface to a database or to instances of the technical system;

A modeling entity, which is adapted for modeling the determined requirements commonly with the determined technical system state using a DSL language, A decision logic, which is adapted for analyzing in the modeled system whether the requirements are met by the technical system and in case of non-compliance triggering a processor:

for computing requirement control instructions, that indicate how the requirements have to be adapted, so that they are feasible by the technical system and concurrently for computing system control instructions, that indicate how the technical system state has to be amended in order to meet the requirements An interface for providing a result of the analyzer.

According to a preferred embodiment, the above described system state analyzer further comprises a user interface, which is adapted for detecting user input signals, indicating a confirmation of the computed control instructions. The requirement interface and the user interface may be integrated in one common interface or vice versa, the requirement interface may be implemented as user interface. Another option is to implement the interface for providing the result as input interface, too.

In another aspect, embodiments of the invention refer to a computer program, tangibly embodying a program of machine-readable instructions executable by a digital processing apparatus to perform a method described above, if the program is executed on the digital processing apparatus. In particular, the computer program is adapted to execute the steps of:

Receiving determined requirements for the technical system

Receiving a determined state of the technical system

Modeling the determined requirements commonly with the determined technical system state using a formal description, like a domain specific language (DSL)

In the modeled system: analyzing whether the requirements are met by the technical system and in case of non-compliance:

computing requirement control instructions, that indicate how the requirements have to be adapted, so that they are feasible by the technical system and concurrently computing system control instructions, that indicate how the technical system state has to be amended in order to meet the requirements.

The computer program may be processed in a distributed manner, such as that certain steps are performed on a first computing entity and that other steps are performed on a second computing entity.

The computer program may be offered, placed on market, used, imported and/or stored as (and thus may be part of) a computer program product. Thus, the computer program may be provided on a storage medium (computer readable medium, like a computer disc or a memory stick etc.). Alternatively, the computer program may be provided via download by means of a respective network connection to a server, which stores the computer program by providing a link to the server with the computer program stored thereon. A "computer-readable medium" or "storage medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

The term "computer" refers to any electronic device comprising a processor, such as a general-purpose central processing unit (CPU), a specific purpose processor or a microcontroller. A computer is capable of receiving data (an input), of performing a sequence of predetermined operations thereupon, and of producing thereby a result in the form of information or signals (an output). Depending on context, the term "computer" will mean either a processor in particular or can refer more generally to a processor in association with an assemblage of interrelated elements contained within a single case or housing.

The systems and methods described herein may be embodied by a computer program or a plurality of computer programs, which may exist in a variety of forms both active and inactive in a single computer system or across multiple computer systems. For example, they may exist as software program(s) comprised of program instructions in source code, object code, executable code or other formats for performing some of the steps. Any of the above may be embodied on a computer readable medium, which include storage devices and signals, in compressed or uncompressed form.

BRIEF DESCRIPTION

Figure 2:
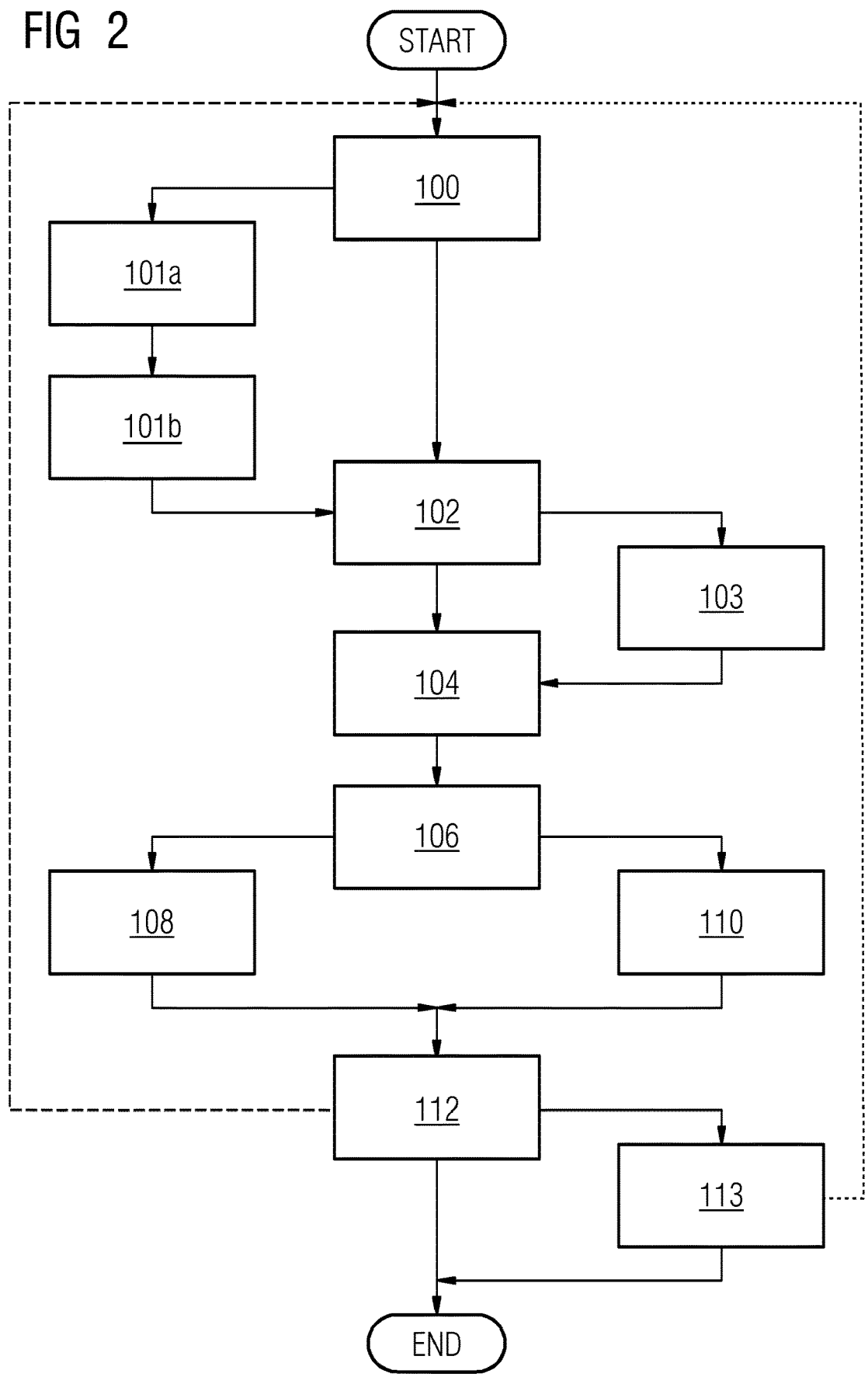
Figure 3:
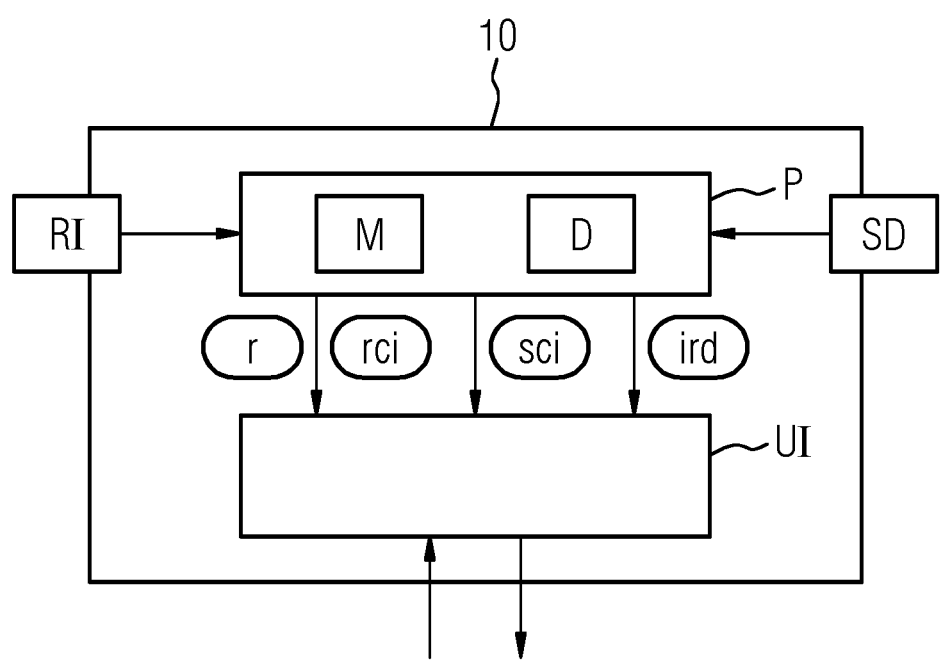

Some of the embodiments will be described in detail, with references to the following figures, wherein like designations denote like members, wherein:

FIG. 1 schematically depicts an integrated platform for processing requirements for a technical system, in accordance with embodiments of the present invention;

FIG. 2 depicts a flow chart, depicting some alternatives for a method for processing requirements for the technical system, in accordance with embodiments of the present invention; and FIG. 3 depicts a block diagram of a system state analyzer according to an embodiment of the present invention of FIG. 1, in more detail.

DETAILED DESCRIPTION

FIG. 1 shows an integrated platform for valuation of requirements RAM according to a preferred embodiment of the present invention in a schematic and exemplary manner.

In the middle there is depicted a system state analyzer 10, which is a core computing entity of the platform according to embodiments of the invention. The system state analyzer 10 serves for digitally processing requirements RAM for a technical system T. The system state analyzer 10 comprises:

A requirement interface RI for determining the requirements RAM. The requirements are defined in a requirement definition computing device REQ-D, or could be described by written documents such as contracts.

A system detector SD, which is interfacing with the technical system T, in particular with a railway system and which is adapted for determining a state s of the technical system T. In a preferred embodiment, performance data p are detected in the technical system T and forwarded to the system state analyzer 10.

A processor P for data processing and for providing a result r.

The general background of embodiments of the invention is as follows.

Developers of technical systems, like the applicant, regularly enter into contracts, or participate in calls for tenders, that involve engineering, manufacturing and delivery of large, complex technical systems and typically have a large financial project volume, and/or may involve contractual obligations over long periods of time. Examples are Engineering, Procurement and Construction (EPC) contracts for industrial plants, or Manufacture and Supply Agreements (MSA) for railway projects which may also be combined with Train Services Agreement (TSA) over periods of up to 30 years.

Frequently, so-called Non-Functional Requirements (NFRs) are defined in these contracts, which may also be described as quality requirements. Among these are requirements regarding Reliability, Availability and Maintainability RAM, or requirements regarding other performance measures such as output yield, which are important performance indicators and are special in that they require quantification of random failures as well as the assessment of their technical effects on system performance. Non-conformance with contractual RAM requirements by a company may result in severe penalties and other costs over long time periods, besides potential loss of reputation. Failure to properly quantify the financial impact and risk (valuation) of contractual RAM requirements may significantly reduce the profitability of projects or lead to lost opportunities.

Contractual RAM requirements and corresponding potential penalties and other costs and technical impacts are often defined by complex contractual agreements. These include complicated, even time-dependent, performance criteria (depending on the technical system) and warranty agreements (e.g. looping of warranty, back-to-back coverage). For instance, a TSA contract may define penalties depending on the average or maximum delays (or delays over a defined threshold) during certain periods, number of cancellations, observed train frequency, availability of trains during weekdays and weekends, etc. An EPC contract for an industrial plant may define penalties depending on the average output for given periods with or without a defined cap, or depending on the number of plant shutdowns, or a combination thereof, etc.

Complex technical systems T integrate various subsystems and not only involve contractual relations with one end customer, also with multiple parties (e.g. suppliers or consortium partners).

Due to the complex nature of the technical system T, assessment of the impact of random technical failures and other (possibly random) influences like environmental and operational factors and their effects on system performance may require the set up and evaluation of rather elaborate computational models (such as stochastic simulation models).

Sometimes, there is no "best" solution with respect to technical or contractual alternatives. However, a so called Pareto optimum may exist, which needs to be determined and calculated by means of using statistical and computational tools. The pareto optimum refers to a system' state, in which one requirement or state parameter is changed that makes at least one parameter better off without making any other parameter worse off Thus, according to a preferred embodiment of the present invention, an optimization procedure is executed in order to synchronize the requirements RAM with the system state in case of non-compliance. The optimization procedure may be based on processing a pareto optimum.

The analysis according to embodiments of the invention considers that all of the above mentioned requirement-based (contractual, commercial) and technical aspects are to a large extent interrelated.

The following described herein provides an integrated approach that is capable of dealing with these difficulties by efficient, flexible and adequate modeling of technical aspects. These aspects can be described in domain language with input validation and advanced consistency checks.

Therefore, it allows efficient, flexible and adequate valuation of contractual RAM requirements, already in early stages before the contract is signed.

This enables decision-making as to technical or contractual alternatives for the benefit of e.g. technical project managers. It can be useful for negotiations with customers or suppliers, and for assessing technical or contractual alternatives, where negotiators can enter different alternatives (domain specific) and immediately see the differences in the risk involved by the changes.

The technical processing relates to the valuation of contractual RAM requirements by deeply integrating models for contractual and commercial aspects, together with models for the impact of random technical failures and other (possibly random) influences like environmental and operational factors and their effects on system performance.

This is executed by means of an algorithm running on a processor P within a suitable computational framework that is powerful enough for that purpose, yet provides an efficient, flexible and adequate way to set up the models, namely described in a Domain-Specific Languages (DSL).

A DSL is a formalized language. Examples for the field of business contracts are WSPC, BCL.

More specifically, embodiments of the invention uses DSLs to describe the contractual RAM requirements defined by one or more contracts (e.g. with customers, suppliers or consortium partners). Also in this step, formal methods for contract analysis can be applied to e.g. merge contract conditions, detect conflicts etc. Further, the invention uses DSLs to define (higher abstraction) models for the impact of random technical failures and other (possibly random) influences like environmental and operational factors and their effects on system performance. These models may also be translated into more low-level computational models, which are analyzed by invoking e.g. stochastic simulation packages. Thus, a stochastic simulation may be subject to further processing of the result, provided by the system state analyzer 10.

The method uses the interrelation of the above two aspects as well as for its ensuing financial consequences in such a way that these can be analyzed and assessed simultaneously. For instance, if a contract condition could potentially be violated, the likelihood for technical failures is calculated and combined with the financial or other (e.g. environmental) consequences in order to calculate one or more risk measures.

For example in a railway project, which involves contracts with the end customer as well as with different suppliers, the technical system T is defined by a model for the impact of random technical failures and their effects on system performance. For example, one or more computational library/ies may be invoked for the computations. The results r can then be appropriately visualized on a user interface UI.

The following refers to a network setup between several computing entities, like the requirement definition device REQ-D, the technical railway system T and the system state analyzer 10 as can be seen in FIG. 1 as a deeply integrated approach that is capable of dealing with interrelated contractual, commercial and technical aspects of RAM requirements. The RAM requirements may even be heterogeneous, which means that they refer to different aspects of the system like other functions. They might be given and/or processed in a qualitative or quantitative manner. The system state analyzer 10 uses Domain-Specific Languages (DSLs) to model these aspects, which provides a means for efficient, flexible and adequate (and transparent to all parties) valuation of contractual RAM requirements and the associated monetary or other risk measures (including the possibility of formal contract analysis), in order to enable decision-making as to technical or requirement-based alternatives.

According to a preferred embodiment, the system state analyzer 10 is adapted to check and evaluate—possibly by user confirmation—consistency of input parameters, in particular of the determined (inputted) requirements. The checks are performed automatically.

The system state analyzer 10 checks, whether the models are "correct by construction" and allows time saving due to efficient specification of adequate computational models. Further, using DSLs in the system state analyzer 10 has the technical effect of efficient computation due to higher abstraction levels.

As can be seen in FIG. 1, the system state analyzer 10 may generate system control instructions sci which may be fed back again to the technical system T for adapting the technical system according to the analysis of the system state analyzer 10. Thus, in case of non-compliance (of system T) with requirements RAM a user may choose how to amend the technical system T as to which requirement is at best violated such that the penalty costs or another impact is/are as low as possible. This is achieved by providing a mask on the user interface UI, on which the user may choose his option by clicking on a respective field, which will be provided on the user interface UI. In addition, more detailed information may be provided, if the user clicks on a respective button (e.g. "?"). The system control instructions sci may be sent to the technical system T and may be processed in the technical system T in order to amend its state.

FIG. 3 shows the system state analyzer 10 of FIG. 1 in more detail. In this example, the system state analyzer 10 directly comprises a user interface UI for receiving user input signals and for providing the result r and other meta data. As shown in FIG. 3, it is possible to provide the computed requirement control instructions rci, the system control instructions sci and impact result data ird on the user interface UI. The impact result data ird is a data set, representing the technical impact of non-compliance with the requirements, due to for example a decrease in system performance p.

The processor P comprises:
A modeling entity M, which is adapted for modeling the determined requirements RAM uniformly and together with the determined technical system state s using a DSL language; The generated model may be provided as output on the user interface UI for user confirmation or adaption.
A decision logic D, which is adapted for analyzing in the modeled system whether the requirements RAM are met by the technical system T. In case of non-compliance the decision logic D triggers the processor P for computing control instructions, namely:
for computing requirement control instructions rci, that indicate how the requirements RAM have to be adapted, so that they are feasible by the technical system T and concurrently
for computing system control instructions sci, that indicate how the technical system state s has to be amended in order to meet the requirements RAM.

FIG. 2 shows a flow chart for valuating contractually coded requirements in a technical system T with some optional features.

After START of the computer implemented method, which is executed in the system state analyzer 10 (a computing device), in step 100 the requirements RAM are received in a determined form. In step 102 the state s of the technical system T is determined or is received in a determined form. This may be done by detecting input signals from the technical system T or via reading data, e.g. provided by the manufacturer of the system T via interface SD.

In a preferred (optional) embodiment of the method, in step 101a a possible conflict in the determined requirements RAM is automatically detected. In step 101b the (potentially) detected conflict will be automatically resolved by providing a corrected suggestion RAM' for at least one of the requirements RAM. However, this corrected suggestion may only be used for the system if the method is executed at design time. Generally, it is possible to provide the corrected requirements RAM' (not shown in the figures) on the user interface UI for the purpose of user confirmation. In case the user confirms the corrected version of the requirements RAM', then the system state analyzer 10 uses this corrected version of the requirements RAM' for calculations (instead of the original requirements RAM).

In a preferred (optional) embodiment of the method, in step 103, performance data p of the technical system T are determined. It has to be noted, that this step may also be executed sometimes else, for example after a first iteration and after having provided a first result r.

In step 104 the determined requirements RAM are commonly determined for the determined technical system state s, using a formal description, namely the domain specific language DSL.

After this, in step 106 it is then possible to execute computer implemented calculations in the generated model. In step 106 it is analyzed whether the requirements RAM are met by the technical system T. In case of compliance the result r may indicate the compliance. In case of non-compliance, system control instructions sci are computed in step 108, that indicate how the requirements RAM have to be adapted, so that they are feasible by the technical system T in the actual state s. Simultaneously, requirement control instructions rci are computed in step 110, that indicate how the technical system T or the state s thereof has/have to be amended in order to meet the determined requirements RAM.

In step 112, the result r is provided. The result r may be subject to further processing by applying stochastic algorithms.

In another preferred (optional) embodiment of the method, in step 113, impact result data ird are calculated and provided, indicating the impact of non-compliance according to the determined requirements RAM.

As shown in FIG. 2 after step 112 or step 113 the method may be executed iteratively, which is depicted by the dotted lines.

The computer-based calculation of the result r thus comprises two technical effects in case of non-compliance: on the one hand, a first actuating variable is provided for adaption of the technical system, by changing the state s and on the other hand, a second actuating variable is provided for adaption of the requirements RAM in the requirement definition device REQ-D.

In sum the invention refers to a method and system with an approach for processing requirements RAM in view of a technical system T. Both, the requirements RAM as well as the technical system T is modeled commonly within on single model, which makes it possible to process interdependencies between these two aspects (requirement and system). A technical advantage of this common modeling is to reduce redundant processing, because all the input data may be processed in common in one data processing tool. Moreover, storage capacity may be reduced as both sides (requirement side and system side) are processed in common and concurrently and not sequentially. Further, it is no longer necessary to execute distinct programs for the requirement side and for the system side.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for processing requirements for, and operating, a technical system, wherein the technical system is a traffic-engineering system, employing at least one processor configured to execute computer-executable instructions stored in a memory, the method comprising:
   receiving determined requirements, wherein the determined requirements describe how the technical system is built and include a required performance indicator, wherein the required performance indicator is at least one of a reliability value, an availability value, a maintainability value, and an output yielded value;
   determining a state of the technical system by receiving input signals directly from the technical system, wherein the state of the technical system comprises technical parameters, wherein the technical parameters comprise a failure state with failure detection;
   modeling the determined requirements commonly with the determined state using a formal description, the formal description being a domain specific language;
   analyzing, in the model, whether the determined requirements are met by the technical system, and in case of non-compliance:
      computing system control instructions, that indicate how the determined requirements have to be adapted, so that the determined requirements are feasible by the technical system and concurrently computing requirement control instructions, that indicate how the determined state has to be amended in order to meet the determined requirements;
   outputting the computed requirement control instructions to the technical system;
   amending the state of the technical system according to the outputted computed requirement control instructions; and
   operating the technical system in the amended state.

2. The method according to claim 1, wherein the technical system is a railway system.

3. The method according to claim 1, wherein the technical parameters comprise at least one of a reliability parameter set of the technical system, an availability parameter set of the technical system, a maintainability parameter set of the technical system, and a product yield parameter set of the technical system.

4. The method according to claim 1, further comprising:
   determining performance data of the technical system, wherein the performance data compares actual performance with the required performance indicator.

5. The method according to claim 1, wherein the method further comprises the following steps in case that the technical system does not meet the determined requirements:

calculating impact result data, indicating the impact of non-compliance according to the determined requirements.

6. The method according to claim 1, wherein in case at least one requirement is not met, automatically analyzing whether the at least one requirement violation impairs compliance with other requirements.

7. The method according to claim 1, further comprising: automatically detecting a conflict in the determined requirements and to automatically resolve the detected conflict by providing corrected suggestion for at least one requirement of the determined requirements.

8. The method according to claim 1, further comprising: providing a result of the analysis and in case of non-compliance: the computed system control instructions and the computed requirement control instructions on a user interface.

9. A computer program product, tangibly embodied in a machine-readable storage medium, including instructions operable to cause a processor to perform the method steps according to claim 1.

10. A system state analyzer for digitally processing requirements for, and operating, a technical system, wherein the technical system is a traffic engineering system, comprising:
   a requirement interface for receiving determined requirements, wherein the determined requirements describe how the technical system is built and include a required performance indicator, wherein the required performance indicator is at least one of a reliability value, an availability value, a maintainability value, and an output yielded value;
   a system detector, adapted for interfacing with the technical system and adapted for receiving input signals from the technical system to determine a state of the technical system, wherein the state of the technical system comprises technical parameters, wherein the technical parameters comprise a failure state with failure detection;
   a modeling entity, adapted for modeling the determined requirements commonly with the determined state using a domain specific language;
   a decision logic, adapted for analyzing in the modeled system whether the determined requirements are met by the technical system and in case of non-compliance triggering a processor:
      for computing requirement control instructions, that indicate how the determined requirements have to be adapted, so that the determined requirements are feasible by the technical system and concurrently,
      for computing system control instructions (sci), that indicate how the determined state has to be amended in order to meet the determined requirements, and
   an interface for
      outputting the computed system control instructions to the technical system;
      amending the state of the technical system according to the outputted computed system control instructions; and
      operating the technical system in the amended state.

11. The system state analyzer according to claim 10, wherein the user interface is further adapted for detecting user input signals, indicating a confirmation of the computed control instructions.

* * * * *